United States Patent [19]

Sutliff et al.

[11] Patent Number: 5,227,737
[45] Date of Patent: Jul. 13, 1993

[54] METHOD AND APPARATUS FOR ADJUSTING THE POLE POSITIONS OF A DIFFERENTIATING AMPLIFIER

[75] Inventors: David E. Sutliff, Eagan; Jeffrey A. Gleason, Minneapolis, both of Minn.

[73] Assignee: VTC Inc., Bloomington, Minn.

[21] Appl. No.: 622,711

[22] Filed: Dec. 5, 1990

[51] Int. Cl.$^5$ .............................. H03G 3/18
[52] U.S. Cl. .................. 330/254; 330/281; 330/306
[58] Field of Search ........ 330/107, 129, 141, 252, 330/254, 279, 281, 306; 360/67, 68

[56] References Cited

U.S. PATENT DOCUMENTS

| | | | |
|---|---|---|---|
| 3,838,210 | 9/1974 | Peil | 330/254 X |
| 4,586,155 | 4/1986 | Gilbert | 364/841 |
| 4,691,120 | 9/1987 | Kondo | 307/265 |
| 4,694,204 | 9/1987 | Nishijima et al. | 330/252 |
| 4,713,628 | 12/1987 | Nelson | 330/254 |
| 4,748,422 | 5/1988 | Matsumoto et al. | 307/494 |
| 4,881,043 | 11/1989 | Jason | 330/306 X |
| 4,888,502 | 12/1989 | Jarrett | 330/306 X |
| 5,157,559 | 10/1992 | Gleason et al. | 360/46 |

Primary Examiner—Steven Mottola
Attorney, Agent, or Firm—Kinney & Lange

[57] ABSTRACT

An amplifier is compensated for variations in element values. A trim signal is generated based on element values of filter elements of a filter in the amplifier. An RC product in the amplifier is controlled based on the trim signal. The RC product corresponds to a product of a dynamic resistance value of a dynamic resistance element in the filter in the amplifier, and a capacitance value of capacitive elements in the filter. The RC product also determines a pole position of the amplifier. Gain in the amplifier is controlled based on the trim signal so that a desired gain is maintained.

22 Claims, 3 Drawing Sheets

METHOD AND APPARATUS FOR ADJUSTING THE POLE POSITIONS OF A DIFFERENTIATING AMPLIFIER

A co-pending patent application entitled ADJUSTABLE BANDWIDTH DIFFERENTIATING AMPLIFIER FOR MAGNETIC DISK DRIVE filed on Apr. 26, 1989 having Ser. No. 07/344,166 and continued by Ser. No. 07/742,055 filed Aug. 6, 1991 and having issued on Oct. 20, 1991 as U.S. Pat. No. 5,157,559 and assigned to the same assignee as the present invention is hereby incorporated by reference.

BACKGROUND OF THE INVENTION

This invention relates to a pulse slimmer amplifier circuit for a magnetic disk drive. More particularly, this invention relates to compensating a differentiating amplifier for variations in the values of filter elements in the amplifier.

In magnetic recording systems, information is often recorded on a magnetic disk which is divided into concentric tracks. The concentric tracks, in turn, are divided into sectors for storing magnetically encoded information. A transducer, or read head, flies above the surface of the magnetic disk to magnetically encode information onto the disk or read magnetically encoded information from the disk. When reading information from the disk, the read head flies over selectively magnetized portions of the disk. The selectively magnetized portions represent digital information stored on the magnetic disk. The read head, when flying over the magnetized portions, generates a pulsed signal representative of the digital information stored on the disk. This pulsed signal is then amplified and demodulated to recover the digital information.

In certain types of magnetic recording schemes, digital information is recorded at different frequencies. The recording frequency is dependent upon the concentric track of the magnetic disk upon which the information is being written. For example, employing a technique called, "zone-density recording", information on different tracks is recorded at different frequencies. In zone-density recording, the recording frequency is varied to maintain a consistent bit density on the magnetic disk from the inside track to the outer most track. In the recovery of information which has been recorded using zone-density recording, it is necessary to employ a differential amplifier having a bandwidth capable of receiving the pulsed signal and detecting the frequencies of the data pulses. The recording frequency varies from track to track, and can vary as much as two (2) times over the radius of the disk.

As the recording frequency increases, the data pulses read from the magnetic disk, which represent the digital information stored on the magnetic disk, tend to crowd together and become much more difficult to separate in the reading and demodulating circuitry. Therefore, a technique known as pulse slimming is used in the recovery of the data. Pulse slimming makes the pulses read from the magnetic disk narrower or slimmer. This is accomplished at both the leading and trailing edges of the pulse by subtracting the first derivative of the pulse from the pulse itself.

The circuit elements used to obtain the first derivative of the data pulses retrieved from the magnetic disk are connected to form an integrated differentiator circuit. The differentiator includes a filter network to vary the pole position of the amplifier as the recording frequency varies. This is described in more detail in the patent application entitled ADJUSTABLE BANDWIDTH DIFFERENTIATING AMPLIFIER FOR MAGNETIC DISK DRIVE filed on Apr. 26, 1989 with Ser. No. 07/344,166, with common inventors and assigned to the same assignee as the present invention.

The filter circuit is typically an RC network which includes resistive and capacitive elements. As recording frequencies in the magnetic disk drive industry increase, the value of the filter components used in the differentiator generally decrease. Therefore, the required value of capacitive elements in the filter circuit of the differentiator can be required to be so small that external components cannot be used. In that case, the capacitive elements must be integrated onto a die containing the differentiator.

However, the value of an integrated capacitor can vary significantly with wafer processing. Since the RC product (i.e., a product of the resistive elements and the capacitive elements) in the filter in the differentiator determine the pole position of the differentiator, variations in the values of the capacitive elements cause an undesirable shift in the pole position. Thus, there is a need for a method and apparatus to compensate for variations of element values in an amplifier to maintain desired amplifier characteristics.

SUMMARY OF THE INVENTION

The present invention is a method and apparatus for compensating for variations of element values in an amplifier. A trim signal is generated based on element values of filter elements in a filter in the amplifier. An RC product in the amplifier, which determines a pole position of the amplifier, is controlled based on the trim signal. The RC product corresponds to a product of a dynamic resistance value of a dynamic resistance element in the filter and a capacitance value of a capacitive element in the filter. Gain in the amplifier is also controlled based on the trim signal so that a desired gain is maintained in the amplifier.

DETAILED DESCRIPTION OF THE PREFERRED EMBODIMENTS

1. Amplifier and Related Circuitry

Figure 1:
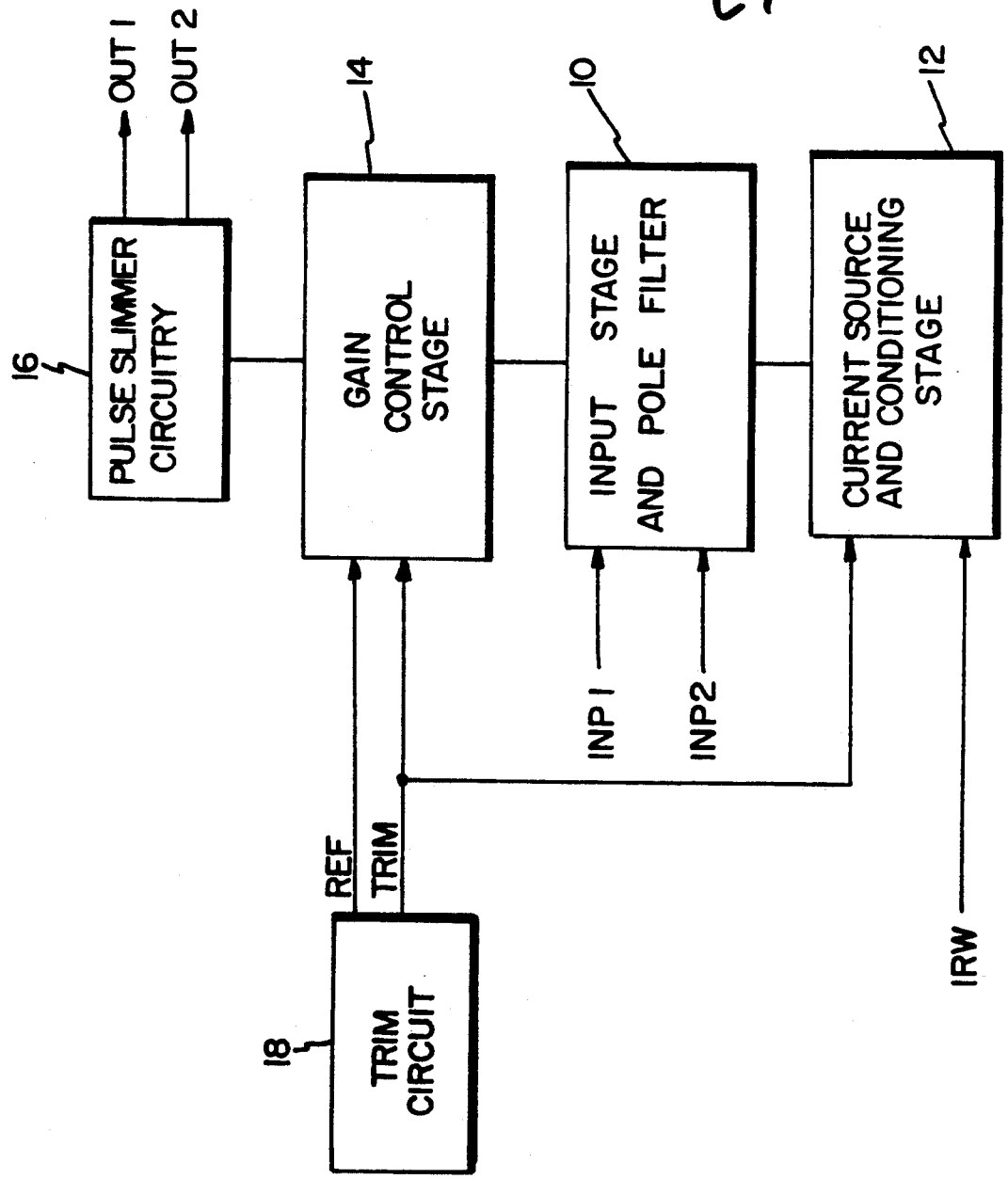
FIG. 1 is a block diagram of an amplifier of the present invention.

FIG. 1 is a block diagram of an amplifier of the present invention. The amplifier includes input stage and pole filter 10, current source and conditioning stage 12, gain control stage 14 and pulse slimmer circuitry 16. FIG. 1 also shows a trim circuit 18. Inputs INP 1 and INP 2 are provided from a magnetic read head (not shown) in a magnetic disk drive to the input stage and pole filter 10.

The pole filter includes a resistive/capacitive network used to tune the bandwidth of the differentiating amplifier to a desired frequency. Input stage and pole filter 10 is also coupled to current source and conditioning stage 12.

An input signal IRW is supplied to current source and conditioning stage 12. The signal IRW is an input current that is proportional to the head position of the magnetic head in the magnetic disk drive. Current source and conditioning stage 12 conditions or modifies IRW in several ways. These modifications include a current-to-voltage conversion as well as compensation for temperature dependence. Current source and conditioning stage 12 is also provided with a trim signal from trim circuit 18. The trim circuit provides the trim signal as a function of the variations in the resistive and capacitive elements used to form the pole filter in the amplifier. The trim signal is combined with the IRW signal to produce an adjusted current in the differentiating amplifier. The adjusted current causes the amplifier to maintain a desired pole position.

However, since the current in the amplifier is adjusted, this also causes an undesirable change in gain of the amplifier. Therefore, gain control stage 14 is provided. Trim circuit 18 provides the trim signal, as well as a reference signal, to gain control stage 14. Based on the trim signal, gain control stage 14 compensates the amplifier for any current adjustments made by the current source and conditioning stage 12 as a result of variations in the resistive/capacitive element values in the pole filter.

Finally, pulse slimmer circuitry 16 is provided for slimming the pulses retrieved from the magnetic disk by the magnetic head and provided to the amplifier at inputs INP 1 and INP 2. Pulse slimmer circuitry 16 provides a slimmed pulse signal at outputs OUT 1 and OUT 2.

Figure 2:
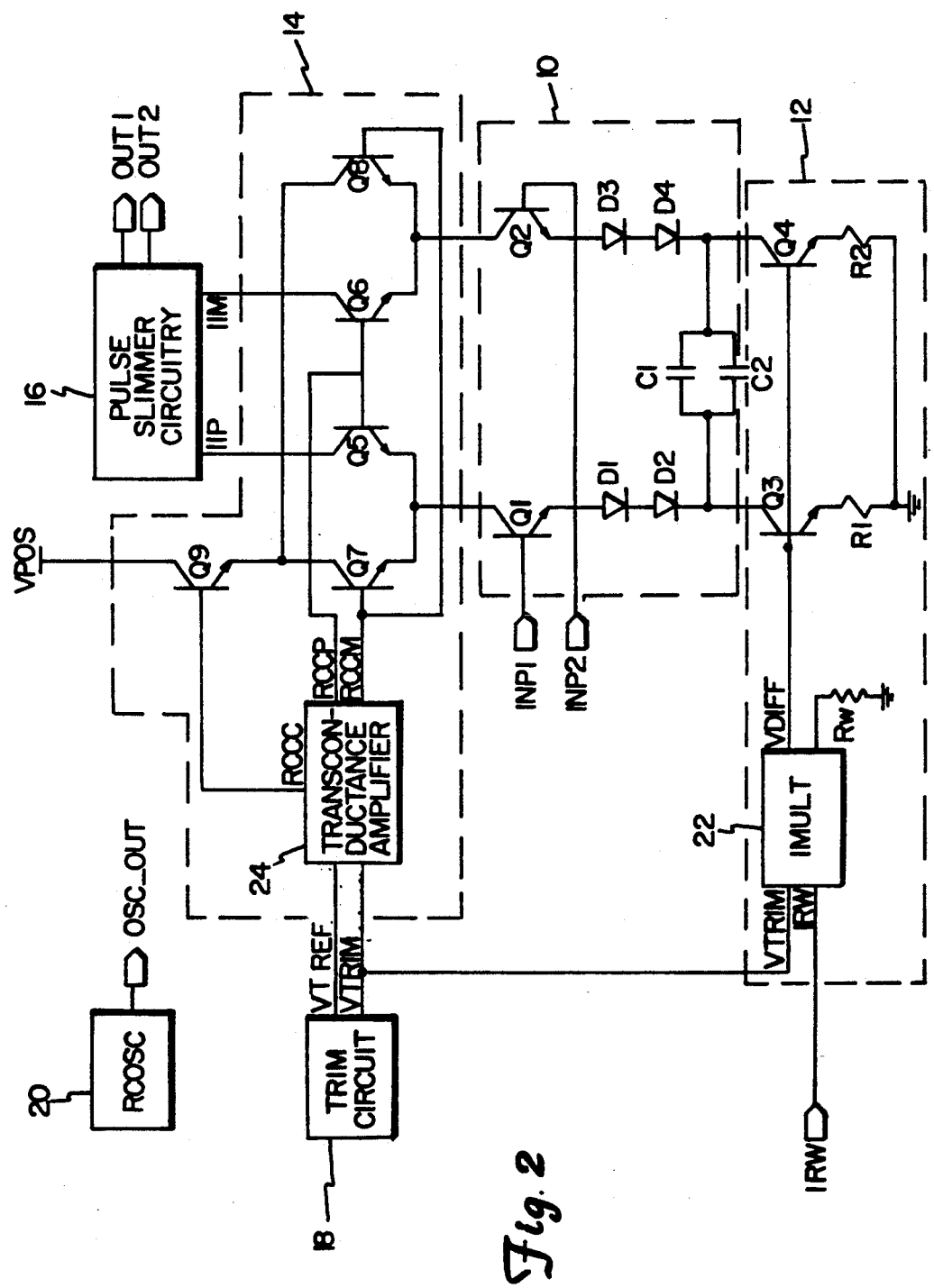
FIG. 2 is a more detailed block diagram of the amplifier shown in FIG. 1, showing certain aspects of the amplifier in schematic form.

FIG. 2 is a more detailed block diagram of the amplifier and trim circuit shown in FIG. 1 In FIG. 2, input stage and pole filter 10, current source and conditioning stage 12, and gain control stage 14 are shown in partially schematic form. Also RC oscillator 20 is provided. Input stage and pole filter 10 includes transistors $Q_1$ and $Q_2$, diodes $D_1$, $D_2$, $D_3$, and $D_4$, and Capacitors $C_1$ and $C_2$. Transistors $Q_1$ and $Q_2$, in this preferred embodiment, are opposing NPN transistors arranged as a differential amplifier.

Each of transistors $Q_1$ and $Q_2$ has its collector connected to another differential pair in gain control stage 14. The bases of transistors $Q_1$ and $Q_2$ are connected to inputs INP 1 and INP 2, respectively. The emitters of transistors of $Q_1$ and $Q_2$ are connected to a filter network including diodes $D_1$–$D_4$ and capacitors $C_1$ and $C_2$. The filter is connected between the emitters of transistors of $Q_1$ and $Q_2$, and the purpose of the filter is to establish the bandwidth of the differential amplifier.

In this preferred embodiment, the filter includes diode $D_1$ having its anode connected to the emitter of transistor $Q_1$ and its cathode connected to the anode of diode $D_2$. Diode $D_2$, in turn, has its anode connected to capacitors $C_1$ and $C_2$, as well as to current source and conditioning stage 12. The filter also includes diode $D_3$ which has its anode connected to the emitter of transistor $Q_2$ and its cathode connected to the anode of diode $D_4$. Diode $D_4$, in turn, has its cathode connected to capacitors $C_1$ and $C_2$ as well as to current source and conditioning stage 12.

Current source and conditioning stage 12 includes base-coupled transistors $Q_3$ and $Q_4$ having their collectors connected to the filter of input stage 10 and their emitters connected to resistors $R_1$ and $R_2$, respectively. Transistors $Q_3$ and $Q_4$ are controlled by current multiplier block (IMULT) 22. IMULT 22 generates a signal VDIFF to vary the current through diodes $D_1$–$D_4$ thereby changing the bandwidth of the differentiating amplifier to correspond to the recording frequency. This is more fully described in the patent application of Gleason et al entitled ADJUSTABLE BANDWIDTH DIFFERENTIATING AMPLIFIER FOR MAGNETIC DISK DRIVE, filed on Apr. 26, 1989 Ser. No. 07/344,166 which is hereby incorporated by reference.

Also, as will be described in greater detail later, IMULT 22 varies the current through diodes $D_1$–$D_4$ to overcome process variations in the capacitance values of capacitors $C_1$ and $C_2$. This "diode current" is varied based on a trim signal (VTRIM) generated in trim circuit 18. VTRIM, in this preferred embodiment, is a voltage representative of the ratio of the dynamic resistance of diodes $D_1$–$D_4$ multiplied by the capacitance of capacitors $C_1$ and $C_2$ to a desired RC product in the pole filter. Therefore, VTRIM is representative of the variation of the RC product in the filter from a desired RC product, due to process variations in the resistive and capacitive element values in the filter.

Gain control stage 14 includes transistors $Q_5$, $Q_6$, $Q_7$, $Q_8$, and $Q_9$, as well as transconductance amplifier 24. Transconductance amplifier 24 is a generally known circuit which generates an output current proportional to an input voltage. Transconductance amplifier 24 drives transistors $Q_5$–$Q_9$ in gain control stage 14 to control the gain of the amplifier. Transistors $Q_5$ and $Q_6$ are connected, at their collectors, to pulse slimmer circuitry 16.

Pulse slimmer circuitry 16 slims data pulses provided by the magnetic head (not shown) by taking the first derivative of the pulses and adding it, at each edge of the pulse, to the pulse itself. Pulse slimmer circuitry 16 provides these "slimmed pulses" at outputs OUT 1 and OUT 2.

2. Operation

As the magnetic head moves from track to track across the magnetic disk, current IRW changes correspondingly to reflect the change in radial position of the magnetic head. In IMULT 22, current IRW is modified in several ways. First, IRW is made proportional to absolute temperature. Second, the absolute temperature dependence of integrated resistors within the amplifier is cancelled by comparing an integrated resistor with external resistor $R_w$ which is required to have a zero temperature coefficient. Third, the input current IRW is converted to a voltage. These three functions are performed by generally known circuitry of any suitable type in IMULT 22.

Although variations in resistance and capacitance due to processing can be measured in many ways, in this preferred embodiment, the RC product of the dynamic resistance of the diodes $D_1$–$D_4$ and the capacitance of the capacitors $C_1$ and $C_2$ in the filter of the amplifier is an important parameter. An oscillator, RC oscillator 20, is included on each die, and is employed to determine the amount of trimming required in trim circuit 18. The period of RC oscillator 20 is dependent on the actual RC product in the filter. RC oscillator 20 is powered only during a current trimming section of wafer testing in order to reduce on-chip power requirements and noise.

The period of RC oscillator 20 is measured, and the results of that period measurement are translated into trim requirements through the use of a look-up table. Thus the look-up table should contain an accurate correlation between the oscillator period and the pole position of the particular differentiating amplifier being trimmed.

Figure 3:
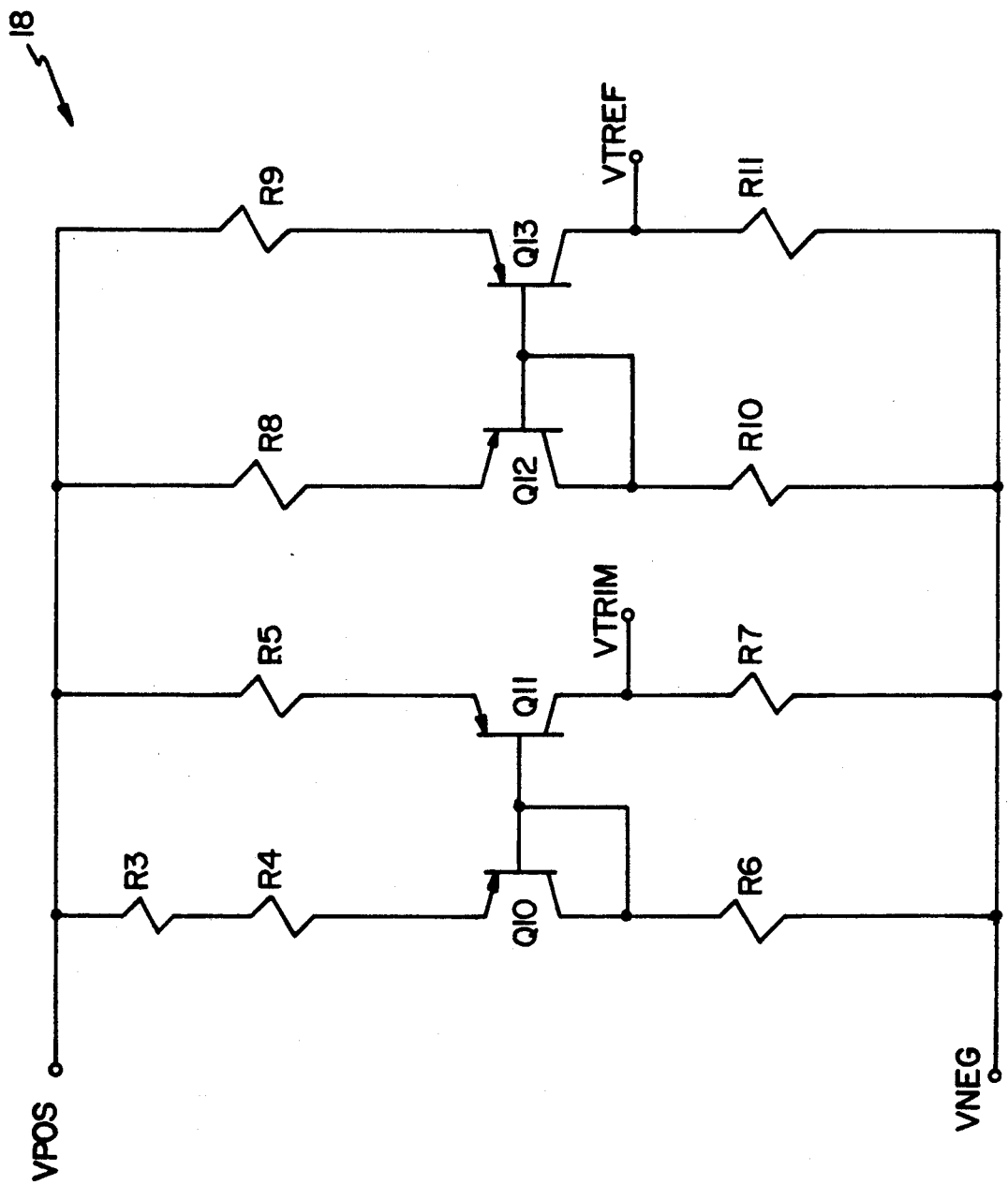
FIG. 3 is a schematic diagram of a trim circuit.

Trim circuit 18 is shown in schematic form in FIG. 3 and includes resistors R3, R4, R5, R6, R7, R8, R9, R10 and R11, and transistors Q10, Q11, Q12 and Q13. Based on the oscillator period measurements, resistor R3 of a PNP current mirror including transistors Q10 and Q11 in trim circuit 18 is trimmed so that trim currents developed in the current mirror are proportional to the ratio of the actually measured RC product in the amplifier to a desired RC product in the amplifier.

A voltage VTRIM is generated at the collector terminal of Q11 of the current mirror in trim circuit 18 based on the trim current developed in trim circuit 18. VTRIM is provided to IMULT 22, and drives a current source in IMULT 22. That current source produces a current in IMULT 22 that is proportional to the trimmed current generated in trim circuit 18. The input current IRW is multiplied by this current as well.

After having been multiplied by this proportional current, input current IRW is converted to a voltage in IMULT 22. This voltage, VDIFF, is applied to the bases of transistors $Q_3$ and $Q_4$. Based on the modifications of IRW due to VTRIM, VDIFF not only reflects the radial position of the magnetic head relative to the magnetic disk (which in turn reflects a change in recording frequency on the magnetic disk) but, VDIFF also reflects the trim signal necessary to overcome capacitance variation in capacitors $C_1$ and $C_2$ due to processing. Therefore, current source and conditioning stage 12 not only shifts the pole position of the amplifier by changing the diode current through diodes $D_1-D_4$ corresponding to a change in recording frequency (which is described in more detail in the previously mentioned Gleason et al patent application) but also generates a trim current in diodes $D_1-D_4$ which is calculated to overcome any deficiency in the capacitance values of capacitors $C_1$ and $C_2$ due to processing.

This change in diode current, however, not only changes the pole position of the amplifier, but also may result in an undesirable change in the gain of the amplifier. Therefore, gain control stage 14 is provided.

Trim circuit 18 also includes an untrimmed current mirror including transistors Q12 and Q13, and resistors R8, R9, R10 and R11. Reference voltage VTREF is generated at the collector terminal of Q13 of the untrimmed current mirror. The voltages VTREF and VTRIM are differential inputs to transconductance amplifier 24 while RCCP and RCCM are differential outputs. Therefore, the voltage seen between RCCP and RCCM is proportional to the natural logarithm of the input voltage. This causes currents in the amplifier which are driven by RCCP and RCCM to be proportional to the original differential between voltages VTREF and VTRIM.

$Q_9$ is connected between the positive supply and the collectors of $Q_7$ and $Q_8$. RCCC is merely a bias voltage and is normally one diode drop above the voltages at the RCCP and the RCCM output of the transconductance amplifier 24. Therefore, any changes in the diode current based on VTRIM are shunted to positive power supply VPOS, and pulse slimmer circuitry 16 sees an essentially constant gain from gain control stage 14.

In short, IMULT 22 modifies VDIFF based on VTRIM to move the pole position of the amplifier to overcome capacitance variations in capacitors $C_1$ and $C_2$ due to processing. By the same token, transconductance amplifier 24 drives transistors $Q_5-Q_9$ based on VTRIM to shunt any current adjustment in the diode currents due to a change in VDIFF, based on VTRIM, to the positive power supply thereby maintaining a substantially constant collector current in transistors $Q_5$ and $Q_6$.

It should be noted that trim circuit 18 could be changed from the embodiment shown in FIG. 3 and still achieve the desired result. As one example, a generally known emitter degenerated NPN transistor current source could be provided in place of resistors R6 and R10.

It should be also noted that the present method of measurement and trimming is based on a generally valid assumption that the RC product in the filter in the amplifier is sufficiently constant across each die. It should also be noted that any suitable method of trimming can be used. In this preferred embodiment, a zener-zap trim method is used. However, a laser link blowing scheme or a laser-based continuous trim scheme utilized in a measure-trim-measure method are also acceptable methods of trimming.

CONCLUSION

In the present invention, a trim signal is developed which is representative of the difference between actual element values in the filter and desired element values. Based on the trim signal, the diode current through diodes $D_1-D_4$ in the filter is adjusted to alter the RC product in the filter to achieve a desired pole position. In this way, capacitance variations in capacitors $C_1$ and $C_2$ due to processing are overcome.

However, gain control stage 14 is also driven by the trim signal. Transconductance amplifier 24 drives transistors $Q_7$, $Q_8$, and $Q_9$ to shunt the portion of the diode current adjusted, based on the trim signal, to the positive power supply. By shunting this adjusted current to the positive power supply, the gain in the amplifier essentially remains constant regardless of the adjustments made in diode current to overcome capacitance variations. Therefore, pulse slimmer circuitry 16 sees a substantially constant gain from the amplifier.

Although the present invention has been described with reference to preferred embodiments, workers skilled in the art will recognize that changes may be made in form and detail without departing from the spirit and scope of the invention.

What is claimed is:

1. A method for adjusting a pole position of a differentiating amplifier, the method comprising:
    generating an adjusted amplifier current based on capacitance values of capacitive filter elements in the differentiating amplifier;
    applying the adjusted amplifier current to a filter circuit in the differentiating amplifier containing the capacitive filter elements to change the pole position of the differentiating amplifier; and
    compensating the differentiating amplifier for the adjusted amplifier current applied to maintain a desired gain in the differentiating amplifier.

2. The method of claim 1 wherein the step of applying comprises:
    passing the adjusted amplifier current through a dynamic resistive element in the filter circuit where an RC product corresponding to a product of the capacitance value of the capacitive filter elements and a resistance value of the dynamic resistive element in the filter circuit determines the pole position of the differentiating amplifier.

3. The method of claim 2 wherein the step of compensating comprises:
shunting the adjusted amplifier current to a power supply.

4. The method of claim 2 wherein the step of generating comprises:
generating a trim signal based on a variation of the RC product from a desired RC product; and
generating the adjusted amplifier current based on the trim signal.

5. A method for compensating for variations of element values in an amplifier, the method comprising:
generating a trim signal based on element values of filter elements in a filter in the amplifier;
controlling an RC product in the amplifier based on the trim signal, the RC product corresponding to a product of a dynamic resistance value of a dynamic resistance element in the filter in the amplifier and a capacitance value of capacitive elements in the filter in the amplifier, the RC product also being determinative of a pole position of the amplifier; and
controlling gain in the amplifier based on the trim signal to maintain a desired gain in the amplifier.

6. The method of claim 5 wherein the step of generating a trim signal comprises:
generating the trim signal based on variations of the product from a desired RC product.

7. The method of claim 6 wherein the step of generating the trim signal comprises:
generating the trim signal based on variations in the capacitance values of the capacitive elements from desired values.

8. The method of claim 5 wherein the step of controlling an RC product comprises:
adjusting the dynamic resistance value of the dynamic resistance element in the amplifier based on the trim signal to achieve a desired pole position of the amplifier.

9. The method of claim 8 wherein the step of adjusting the dynamic resistance value comprises:
adjusting current through the dynamic resistance element based on the trim signal.

10. The method of claim 9 wherein the step of adjusting current comprises:
applying an adjustment current to the dynamic resistance element, the adjustment current having a value based on the trim signal.

11. The method of claim 10 wherein the step of controlling gain comprises:
compensating the amplifier, based on the trim signal, for the adjustment current through the dynamic resistance element to maintain a desired gain in the amplifier.

12. The method of claim 11 wherein the step of compensating the amplifier comprises:
diverting the adjustment current from the amplifier to maintain a substantially constant gain in the amplifier.

13. The method of claim 12 wherein the step of diverting the adjustment current comprises:
shunting the adjustment current to a supply terminal.

14. An apparatus for compensating for variation of element values of filter elements in an amplifier, the amplifier having a filter including a dynamic resistance element and a capacitive element, the apparatus comprising:
generating means for generating a trim signal based on the element values of the filter elements;
means for controlling an RC product in the amplifier based on the trim signal, the RC product corresponding to a product of a dynamic resistance value of the dynamic resistance element in the filter and a capacitance value of the capacitive element in the filter, the RC product also being determinative of a pole position of the amplifier; and
means for controlling gain in the amplifier based on the trim signal to maintain a desired gain in the amplifier.

15. The apparatus of claim 14 wherein the generating means comprises:
means for generating the trim signal based on variations of the RC product from a desired RC product.

16. The apparatus of claim 15 wherein the means for generating the trim signal comprises:
means for generating the trim signal based on variations in the capacitance values of the capacitive elements from desired values.

17. The apparatus of claim 14 wherein the means for controlling an RC product comprises:
means for adjusting the dynamic resistance value of the dynamic resistance element in the amplifier based on the trim signal to achieve a desired pole position of the amplifier.

18. The apparatus of claim 17 wherein the means for adjusting the dynamic resistance value comprises:
means for adjusting current through the dynamic resistance elements based on the trim signal.

19. The apparatus of claim 18 wherein the means for adjusting current comprises:
means for applying an adjustment current to the dynamic resistance element, the adjustment current having a value based on the trim signal.

20. The apparatus of claim 19 wherein the means for controlling gain comprises:
means for compensating the amplifier, based on the trim signal, for the adjustment current through the dynamic resistance element to maintain a desired gain in the amplifier.

21. The apparatus of claim 20 wherein the means for compensating the amplifier comprises:
means for diverting the adjustment current from the amplifier to maintain a substantially constant gain in the amplifier.

22. The apparatus of claim 21 wherein the means for diverting the adjustment current comprises:
means for shunting the adjustment current to a supply terminal.

* * * * *